United States Patent [19]
Beddingfield

[11] Patent Number: 5,977,632
[45] Date of Patent: Nov. 2, 1999

[54] FLIP CHIP BUMP STRUCTURE AND METHOD OF MAKING

[75] Inventor: Stanley Craig Beddingfield, Austin, Tex.

[73] Assignee: Motorola, Inc., Schaumburg, Ill.

[21] Appl. No.: 09/017,562

[22] Filed: Feb. 2, 1998

[51] Int. Cl.$^6$ .................................................. H01L 23/48
[52] U.S. Cl. .......................... 257/737; 257/738; 257/773; 257/780; 257/734
[58] Field of Search .................................... 257/734, 737, 257/738, 772, 773, 778, 779, 780, 786, 792, 784

[56] References Cited

U.S. PATENT DOCUMENTS 5,268,026  12/1993  Henry ........................................... 106/8
5,705,855  1/1998  Carson et al. ........................... 257/737

OTHER PUBLICATIONS

Lau, "Chip on Board Technologies For Multichip Modules", Chapman and Hall, NY, pp. 33–34, 72–73.

Primary Examiner—Minh Loan Tran
Assistant Examiner—Luan Thai
Attorney, Agent, or Firm—Keith E. Witek

[57] ABSTRACT

A passivation layer (16) is formed over a substrate (10) having an interconnect pad (12, 13). An opening in the passivation layer (16) exposes a portion of the interconnect pad (12, 13). A polyimide structure (18, 20) is formed adjacent to the opening in the passivation layer 16. Under bump metallurgy (22, 24) is formed over at least a portion of the polyimide structure (18, 20). A solder bump (28, 26) is formed over the Under bump metallurgy (22, 24).

22 Claims, 4 Drawing Sheets

FLIP CHIP BUMP STRUCTURE AND METHOD OF MAKING

FIELD OF THE INVENTION

The present invention relates generally to semiconductors, and more specifically to flip chip plastic ball grid array packages.

BACKGROUND OF THE INVENTION

The use of flip-chip technology in the semiconductor industry is known. Specifically, with flip-chip technology, a series of bumps are formed upon a silicon substrate in order to facilitate physical and electrical connection of the die to a separate substrate. For example, flip-chip die have been attached to package substrates as well as printed circuit board substrates where device size is of utmost consideration. Once a flip-chip die has been attached to the corresponding substrate, it is necessary to dispense an underfill material into the space between the silicon die and the substrate. Generally, the underfill material is a silica-containing epoxy resin.

The formation of bump structures by evaporation onto the die requires the use of polyimide in order to facilitate proper attachment of the subsequent under bump metallurgy to the bump structure itself and to provide stress relief between the bump and the substrate. For example, it is common for a polyimide layer to be formed across the entire semiconductor die following the formation of the chip passivation layer. Openings through the polyimide to the underlying conductive contacts of the chip are formed to permit the desired contact of the bump to the substrate metallization.

The use of flip chip solder bump technology generally requires a reflow step after the die has been "bumped" with solder in order to form the final spherical bump structure on the die. The controlled collapse chip connection (C-4) bump technology has such an associated high temperature reflow step. With the exposure of the wafer to the high temperature reflow step, the above referenced polyimide material must be formulated to possess a high glass transition temperature (Tg) property above the maximum temperature reached during the reflow process. One problem resulting if the glass transition temperature is reached is that the polyimide layer on the wafer will expand in such a manner that the underlying and adjacent structures to the polyimide are physically damaged. In addition, even if damage were not to occur due to expansion of the polyimide, it is possible for the polyimide to return to a solid state having characteristics different than the original desired characteristics possessed prior to the reflow step. Therefore, physical damage due to expansion and a change of characteristics of the polyimide can cause immediate and long term reliability issues. For example, a change in the polyimide characteristics may limit the adhesion of the polyimide to underlying passivation layers, as well as to the adjacent Under Bump Metallurgy (UBM).

In order for the glass transition temperature of the polyimide currently used for solder bump evaporation to remain sufficiently high, adhesion promoters are excluded from the polyimide formulation. However, with the removal of an adhesion promoter from the polyimide, it has been observed that where the flip-chip devices have been attached to an organic or ceramic board, that subsequent use or temperature cycling causes the adhesion between the underfill material and the polyimide region to deteriorate causing a failure to occur. The failure has been observed to be delamination at the interface of the underfill material and the polyimide material. Adhesion of underfill material to passivation is stronger than to polyimide possessing no adhesion promoters.

One effort in the prior art of dealing with delamination between a underfill material and a polyimide is to use adhesion promoters within the polyimide in order to change the Tg to a point where the properties of the polyimide are not affected. However, the use of adhesion promoters is not feasible where flip-chip solder bump technology is being used because of the required high-temperature reflowing of the bump structures. The problem being again that adhesion promoters actually lower the Tg of the polyimide. The lowering of the Tg causes the reflow step of flip-chip technology to affect the polyimide properties as described above. Therefore, a process capable of overcoming the problems of the prior art would be advantageous.

Figure 1:
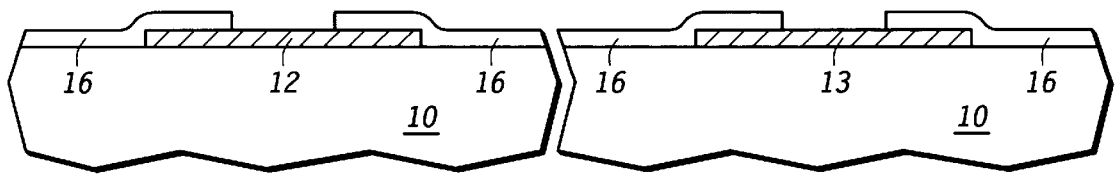
FIGS. 1, 2, 4–6 illustrate in cross section steps associated with forming interconnect sites in accordance with the present invention.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION OF THE DRAWINGS

In the present invention, a passivation layer is formed over a substrate having interconnect pads. An opening in the passivation layer exposes portions of the interconnect pad. Discrete polyimide structures are formed adjacent to each of the openings in the passivation layer. Under bump metallurgy is formed over at least a portion of the polyimide structures. A solder bump is formed over the Under bump metallurgy. By forming discrete polyimide structures as opposed to a single polyimide layer, the reliability problems of the prior art can be avoided.

The present invention is best understood with reference to the figures. FIG. 1 is a cross-sectional view of a semiconductor substrate 10 having conductive pads 12 and 13, and passivation layer 16. In one embodiment, the substrate 10 will comprise a silicon substrate having multiple layers forming transistors and transistor interconnects. Ultimately, the conductive layer nearest the passivation layer, which includes conductive pads 12 and 13, is formed. In other embodiments, the substrate 10 may include a gallium arsenide substrate or other appropriate substrate for the formation of integrated circuits.

In specific embodiments, the conductive pads 12 and 13 are formed using aluminum, copper, or other conductive metals. In other embodiments, alloys or layers of the conductive material may be used to form the conductive pads 12 and 13.

The passivation layer 16 is formed such that there are openings over the pads 12 and 13 to allow for subsequent electrical contact to the conductive portions 12 and 13 of the top conductive layer. In a specific embodiment, the passivation layer 16 is formed by depositing the passivation material onto the wafer, exposing and developing out the required openings.

Figure 2:
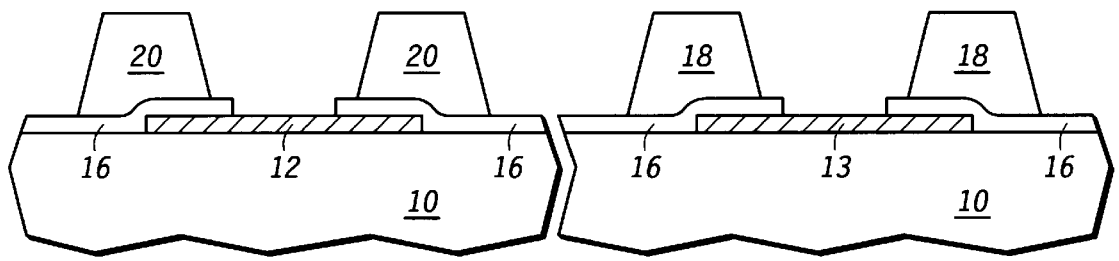

FIG. 2 illustrates the structure of FIG. 1 following the formation of polyimide structures 20 and 18. The polyimide structures 20 and 18 are torroidal structures formed on top of the passivation layer 16 and open within the center of the torroidal structure to expose the conductive contacts 12 and 13. A torroidal structure is considered to be any structure having an opening within its perimeter. For example, a square polyimide structure having an opening over the exposed portion of the conductive layer would be considered a torroidal structure, as would a circular ring structure.

Figure 3:
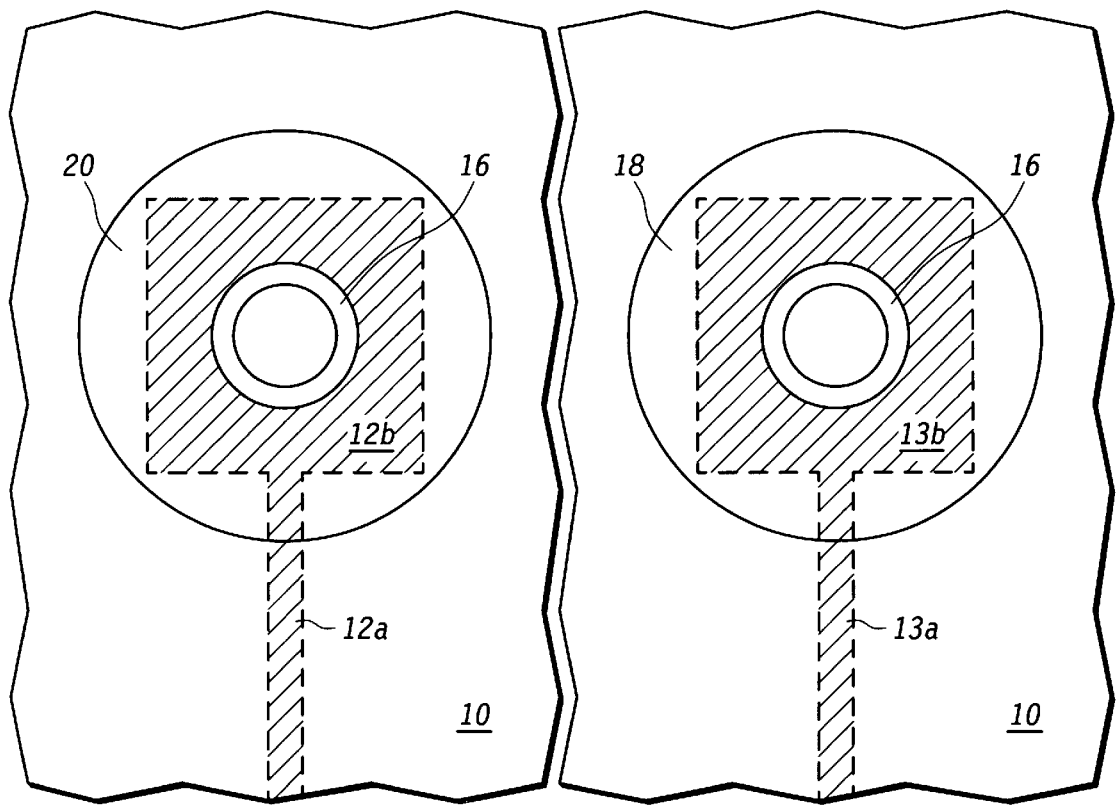
FIG. 3 illustrates a plan view of the cross-sectional portion of FIG. 2.

FIG. 3 illustrates in plan view the relationship of the polyimide structures 18 and 20 to the passivation layer 16, and conductive portions 12 and 13. Specifically, the conductive portions 12 and 13 are shown to consist of trace portions 12a and 13a connecting to a pad portion 12b and 13b, respectively. In one embodiment, the centers of the square shaped pad portions 12b and 13b are visible as illustrated in the cross-sectional view of FIG. 2. In one embodiment, surrounding the visible portion of the conductive pads 12b and 13b would be a small exposed portion of the passivation layer 16 as illustrated in FIG. 3. Surrounding the combination of the exposed conductor pads portions of pads 12b and 13b and the exposed passivation portion 16, is the polyimide structures 18 and 20. The use of the structures 18 and 20 represent an advantage over the prior art in that it limits the amount of polyimide actually used in forming the bump structures. By limiting the amount of polyimide used to an area immediately adjacent to the opening, it is possible to avoid the use of adhesion promoters and use existing polyimide formulations, while assuring adequate adhesion between the die substrate and underfill layer following the reflow process used in some flip-chip structures, as will be discussed in more detail subsequently.

Figure 4:
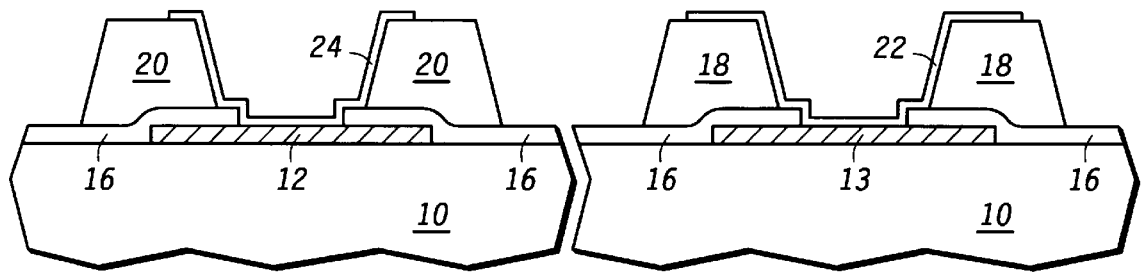

FIG. 4 illustrates a specific embodiment of the present invention, where Under Bump Metallurgy (UBM) structures 24 and 22 are formed over a portion of the polyimide structures 18 and 20. In the embodiment illustrated, the UBM structures are formed within the outer perimeter of the polyimide structures 18 and 20. For example, the structure 22 is shown to start approximately near the center of the top portion of the polyimide structure 18. The UBM is used to promote adhesion of solder to the die, as well as to form a barrier on the aluminum pads 12 and 13 to protect against corrosion of the aluminum, and the solder subsequently used to form the bump structures. Generally, the UBM structures 22 and 24 would be formed of a composite layer. One such composite layer would comprise chrome, copper, and gold. The UBM structure 22 is illustrated to exist within the perimeter of the conductive portion 12, while in a different embodiment, the perimeter of the UBM structure 24 is illustrated to exist outside the perimeter of the conductive portion 13.

Figure 5:
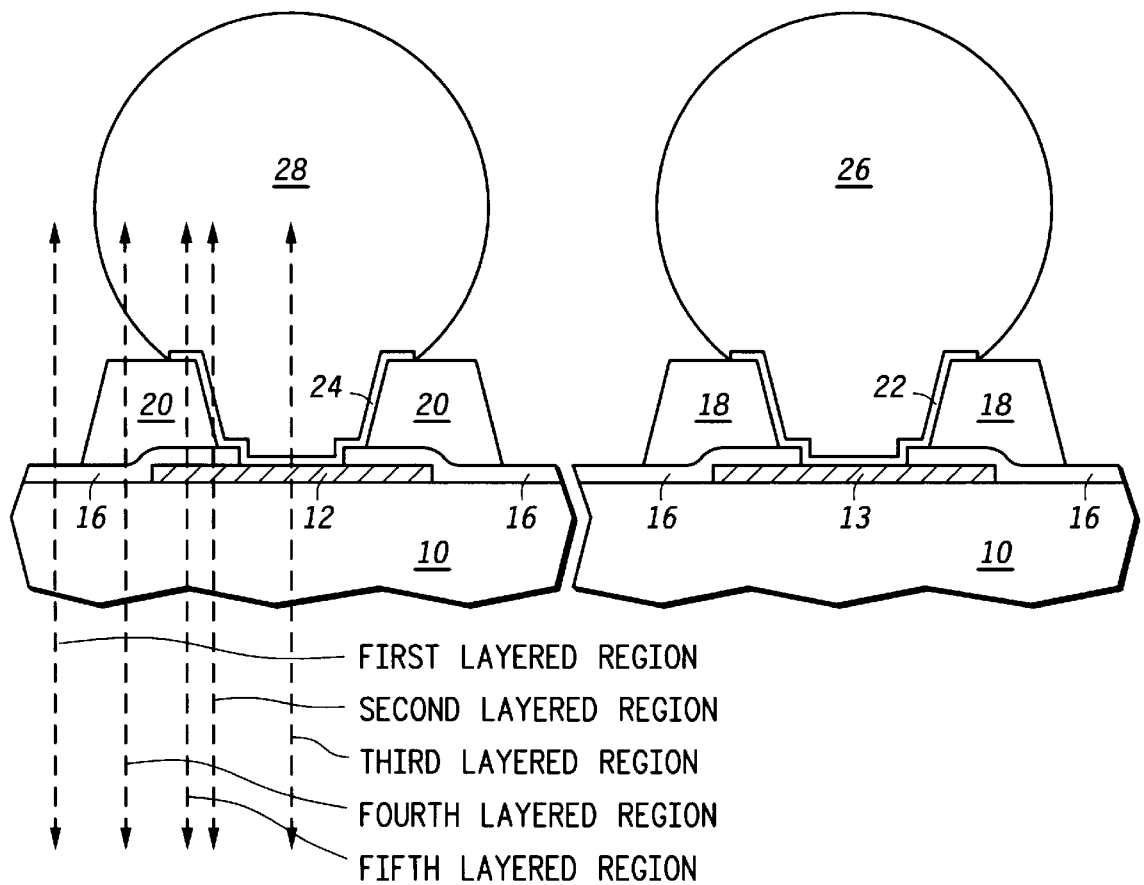

FIG. 5 illustrates in cross-sectional view a completed bump structure following the deposition and reflowing of a solder material in order to form the bump structures 26 and 28. The bump structures 26 and 28 can comprise either high-lead solder bumps, eutectic solder bumps, or other solder compounds appropriate for the purposes put forth herein. The UBM structures 22 and 24, as well as the bump structures 26 and 28 can be formed using any number of known processes.

Figure 6:
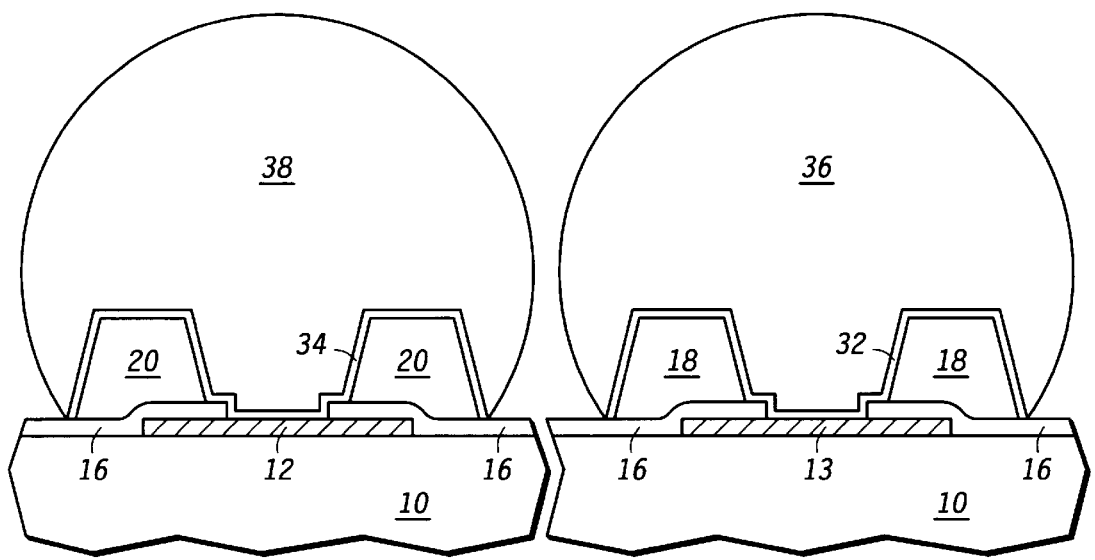

FIG. 6 illustrates another embodiment of the present invention, where the UBM structures 32 and 34 are formed to extend over their respective polyimide structures 18 and 20. By doing so, the subsequent formation of the bump structures 36 and 38 is such that the polyimide is completely isolated by the bump structures 36 and 38, thereby eliminating any exposure of the polyimide structures 18 and 20 to subsequent underfill steps. This to provides an advantage over the prior art in that it eliminates the polyimide-underfill interface which has exhibited reliability problems.

Figure 7:
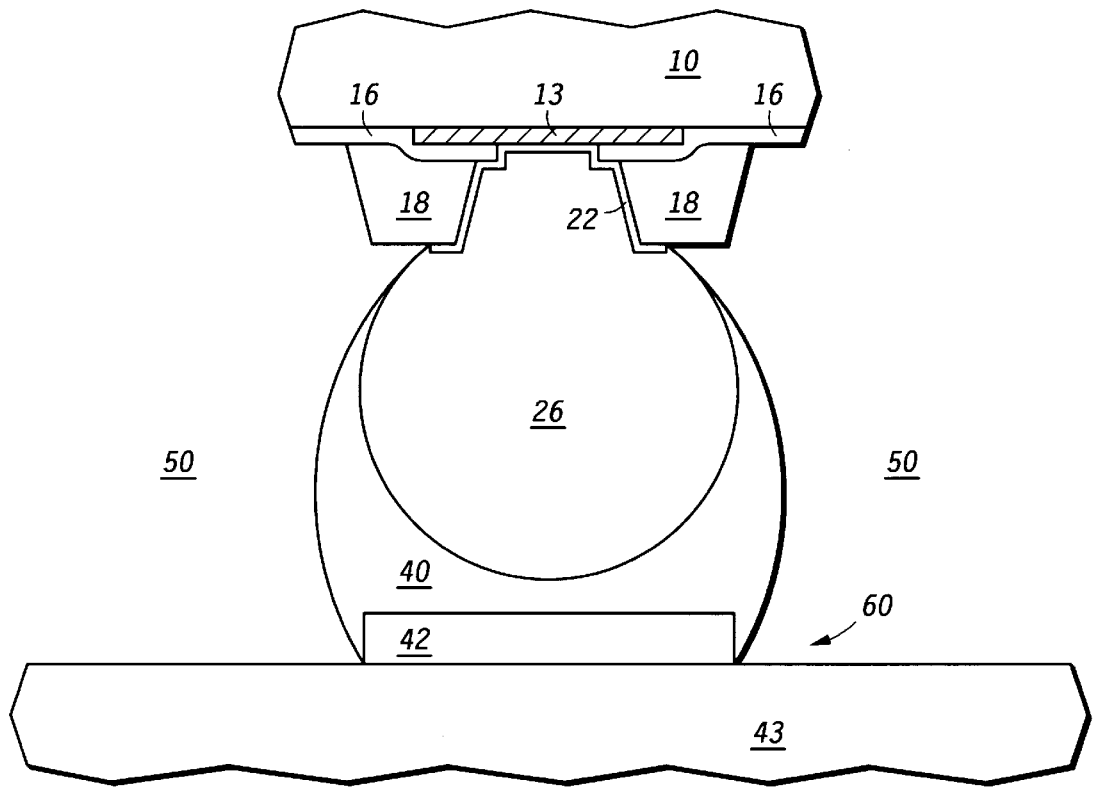
FIG. 7 illustrates, in cross-sectional view, a device having the bump structure of FIG. 5 attached to a substrate.

FIG. 7 illustrates in cross-sectional view the bump structure 26 connected to an organic or ceramic board 60. The board 60 has a conductive contact 42 formed on board 43. The conductive contact 42 is for physically and electrically connecting the conductive contact 42 to the bump structure 26 though the use of a solder 40. The board 60 can be a device package such as a Ball Grid Array package substrate, or a Chip Scale Package substrate. It should be understood that in other embodiments, it would be possible for the bump structure 26 to be formed using a eutectic material whereby the solder portion 40 would not be necessary. Subsequent to the attachment of the substrate 10 to the board 60, the space 50 would be filled using an underfill material. In accordance with the present invention, the underfill material would be in contact primarily with the passivation layer 16 and only a small portion of the polyimide structure 18. By limiting the contact of the underfill material to the polyimide material 18, the chance for failures because of delamination is greatly reduced over the prior art.

Figure 8:
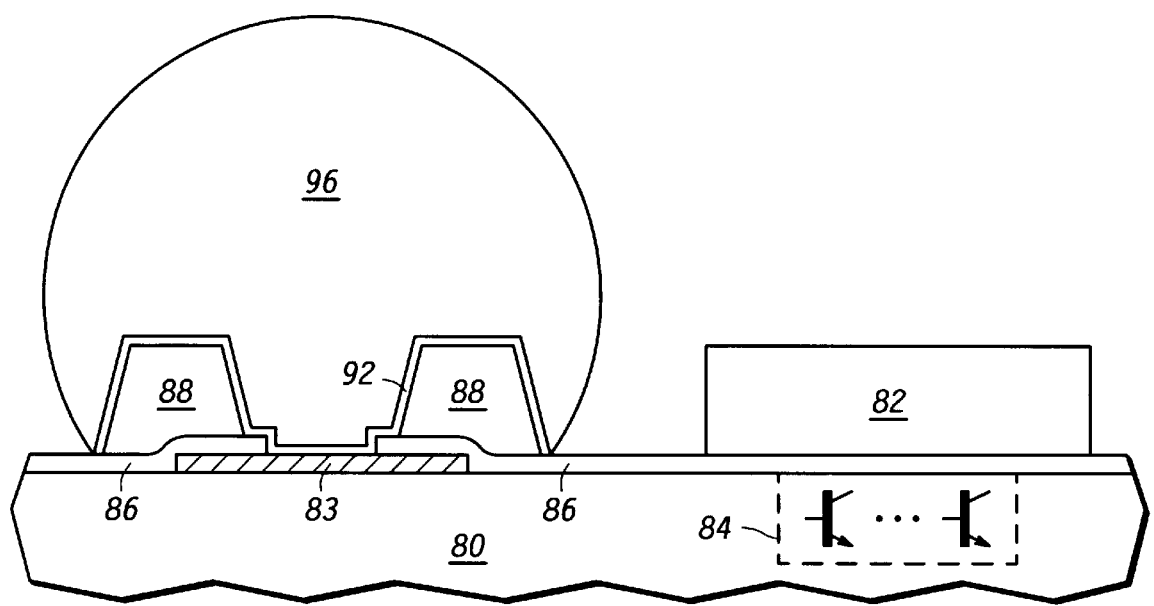
FIG. 8 illustrates an alternate embodiment having an additional polyimide structure.

In another embodiment of the present invention a polyimide structure can be additionally formed in specific areas over the substrate 10 where more protection than that afforded by the passivation layer 16 is needed. For example, as illustrated in FIG. 8, if a structure 84 within a semiconductor device 80 were known to be particularly prone to electrostatic damage, an alternate embodiment would form an additional polyimide structure 82 above the passivation layer 86 covering the electrostatically sensitive portion. Therefore, the present invention does not limit the use of polyimide structures to only the IO locations. The present invention has advantages over the prior art. Specifically, the use of polyimide structures associated with the formation of solder bumps at the substrate level is limited in order to prevent delamination of the polyimide structure during subsequent use of this device.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompass all of the variations and modifications as fall within the scope of the appended claims.

What is claimed is:

1. A semiconductor device comprising:
    a semiconductor substrate having a conductive bond pad;
    a toroidal shaped polyimide structure, the toroidal shaped polyimide structure having an inner sidewall defining an opening, an outer sidewall that surrounds the entire inner sidewall, and a top surface connected therebetween wherein the opening is over at least a portion of the conductive bond pad;
    a conductive layer formed over at least a portion of the toroidal shaped polyimide structure, wherein the conductive layer contacts the conductive pad; and
    a conductive bump structure connected to the conductive layer through the opening.

2. The device of claim 1, wherein the toroidal shaped polyimide structure is annular whereby the inner sidewall is defined by a first radius and the outer sidewall is defined by a second radius wherein the first radius is less than the second radius.

3. The device of claim 1 further comprising a passivation layer under at least a portion of the toroidal shaped polyimide structure.

4. The device of claim 1, wherein the conductive layer is formed over substantially all of the toroidal shaped polyimide structure.

5. The device of claim 1 further comprising a second polyimide area over a portion of the device, the second polyimide area separate from the toroidal shaped polyimide structure.

6. The device of claim 5 wherein the second polyimide area is toroidal shaped by having an inner sidewall defining an opening, an outer sidewall that surrounds the entire inner sidewall, and a top surface connected therebetween.

7. The device of claim 6 wherein another conductive bump structure is formed over the second polyimide area to form a second contact within the device.

8. The device of claim 1, wherein the conductive layer comprises a first conductive layer having a first metallurgy characteristic, and a second layer having a second metallurgy characteristic.

9. The device of claim 1 further comprising a package means coupled to the conductive bump structure.

10. The device of claim 9, wherein the package means is a Ball Grid Array package.

11. The device of claim 9, wherein the package means is a Chip Scale Package.

12. The device of claim 9, wherein an underfill material is directly adjacent to the conductive bump structure.

13. A semiconductor device having a plurality of contact structures, a cross section of one of the plurality of contact structures comprising:
   a surface;
   a first layered region along a first line extending substantially perpendicular from a semiconductor substrate, the first layered region comprising a passivation region formed over the semiconductor substrate, wherein a portion of the passivation region forms a portion of the surface over which no polyimide region is formed and under which no bond pad region is positioned;
   a second layered region along a second line extending substantially perpendicular from a semiconductor substrate and adjacent to the first line, the second layered region comprising a a bond pad region formed over the semiconductor substrate, the passivation region formed directly on the bond pad region, a polyimide region formed directly on the passivation region, and a conductive region formed directly on the polyimide region; and
   a third layered region along a third line extending substantially perpendicular from a semiconductor substrate and adjacent to the second line, the second line being between the third line and the first line, the third layered region comprising the bond pad region formed over the semiconductor substrate, and the conductive region formed directly on the bond pad region but no polyimide region.

14. The device of claim 13, wherein the conductive region comprises an under bump metallurgy and a solder bump.

15. The device cross section of claim 13 furthers comprising:
   a fourth layered region along a fourth line extending substantially perpendicular from a semiconductor substrate and adjacent to the first line, the forth line being between the first line and the second line, the fourth layered region comprising the passivation region formed over the semiconductor substrate, and a polyimide region formed directly on the passivation region, wherein the polyimide region of the fourth layered region forms a portion of the surface.

16. The device cross section of claim 15, further comprising:
   a fifth layered region along a fifth line extending substantially perpendicular from a semiconductor substrate and adjacent to the fourth line, the fifth line being between the second line and the fourth line, the fifth layered region comprising the passivation layer formed over the semiconductor substrate, the polyimide region formed directly on the passivation region, and the second conductive region formed directly on the polyimide region, wherein a portion of the second conductive region forms a portion of the top surface.

17. A semiconductor device having a plurality of contact points, the device comprising:
   a substrate having electrical devices with electrodes where the electrical devices are formed on the substrate;
   a first bond pad and a second bond pad overlying the substrate and connected to electrodes of the electrical devices;
   a passivation layer over a portion of the first and second bond pads;
   a first toroidal shaped dielectric region over the first bond pad and a second toroidal shaped dielectric region over the second bond pad wherein the first and second toroidal shaped regions are physically separated from one another by a gap, each of the first and second toroidal shaped dielectric regions having an inner sidewall defining a contact opening to its respective bond pad and outer sidewall surrounding the inner sidewall; and
   a first conductive bump within the contact opening of the first toroidal shaped dielectric region and a second conductive bump within the contact opening of the second toroidal shaped dielectric region.

18. The device of claim 17 wherein the first and second toroidal shaped dielectric regions are made of a polyimide material.

19. The device of claim 17 wherein the device is flip-chip mounted onto a larger substrate that contains conductive contact regions where the conductive contact regions are electrically coupled to the first and second bond pads.

20. The device of claim 19 wherein an underfill material is formed between the device and the larger substrate where the underfill material contacts both the passivation layer and the outer sidewall of the first and second toroidal shaped dielectric regions.

21. A semiconductor device having a top surface that is exposed to an ambient region, the device comprising:
   a conductive ball region that has a top surface exposed to the ambient region;
   a toroidal dielectric region surrounding a lower portion of the conductive ball region where a potion of the toroidal dielectric region is exposed to the ambient region; and
   a passivation layer underlying the toroidal dielectric region where a surface of the passivation region is exposed to the ambient region.

22. The device of claim 21 wherein the ambient region is filled with an underfill material whereby the underfill material is in contact with all of the conductive ball region, the toroidal dielectric region, and the passivation layer.

* * * * *